United States Patent [19]

Terada et al.

[11] Patent Number: 4,785,204

[45] Date of Patent: Nov. 15, 1988

[54] COINCIDENCE ELEMENT AND A DATA TRANSMISSION PATH

[75] Inventors: Hiroaki Terada, Suita; Katsuhiko Asada, Amagasaki; Niroaki Nishikawa, Suita; Shinji Komori, Itami; Kenji Shima, Nishinomiya; Souichi Miyata; Satoshi Matsumoto, both of Nara; Hajime Asano, Toyonaka; Masahisa Shimizu, Kadoma; Hiroki Miura, Hirakata, all of Japan

[73] Assignees: Mitsubishi Denki Kabushiki Kaisha, Tokyo; Sharp Kabushiki Kaisha, Osaka; Matsushita Electric Industrial Co., Ltd., Osaka; Sanyo Electric Company, Osaka, all of Japan

[21] Appl. No.: 875,551

[22] Filed: Jun. 18, 1986

[30] Foreign Application Priority Data

Jun. 21, 1985 [JP] Japan .................... 60-136603
Jun. 21, 1985 [JP] Japan .................... 60-136604
Jun. 21, 1985 [JP] Japan .................... 60-136605
Jun. 21, 1985 [JP] Japan .................... 60-136606
Jun. 21, 1985 [JP] Japan .................... 60-136607

[51] Int. Cl.[4] ............... H03K 3/353; H03K 21/17; H03K 23/44; H03K 3/286
[52] U.S. Cl. .................... 307/451; 307/481; 307/279; 307/272.2; 377/79; 377/68; 377/117; 377/81
[58] Field of Search ............... 307/451, 475, 481, 279, 307/585, 576, 579, 471, 452, 594, 606, 272.3; 377/115–117, 127, 105, 68, 79, 81, 106

[56] References Cited

U.S. PATENT DOCUMENTS

| 3,829,713 | 8/1974 | Canning | 307/451 X |
| 4,100,429 | 7/1978 | Adachi | 307/279 X |
| 4,114,049 | 9/1978 | Suzuki | 307/452 X |
| 4,275,316 | 6/1981 | Knapp | 307/279 |
| 4,587,665 | 5/1986 | Minakucki | 397/116 |

OTHER PUBLICATIONS

Carver Mead & Lynn Conway, "Introduction to VLSI Systems", 1980, pp. 254 and 255.

Primary Examiner—Stanley D. Miller
Assistant Examiner—David R. Bertelson
Attorney, Agent, or Firm—Birch, Stewart, Kolasch & Birch

[57] ABSTRACT

A coincidence element responsive to a plurality of input signals for outputting the level of the input signals when said plurality of input signals coincide with each other includes, a serial connection of a first electrically conductive type and a second electrically conductive type MOS transistors of the same number, the number being equal to the number of the input signals, responsive to said plurality of inputs connected between a first power supply and a second power supply; and a CMOS inverter responsive to an intermediate output at the connection of the most lower stage first conductivity type MOS transistor and the most upper stage second conductivity type MOS transistor for outputting a coincidence signal.

14 Claims, 14 Drawing Sheets

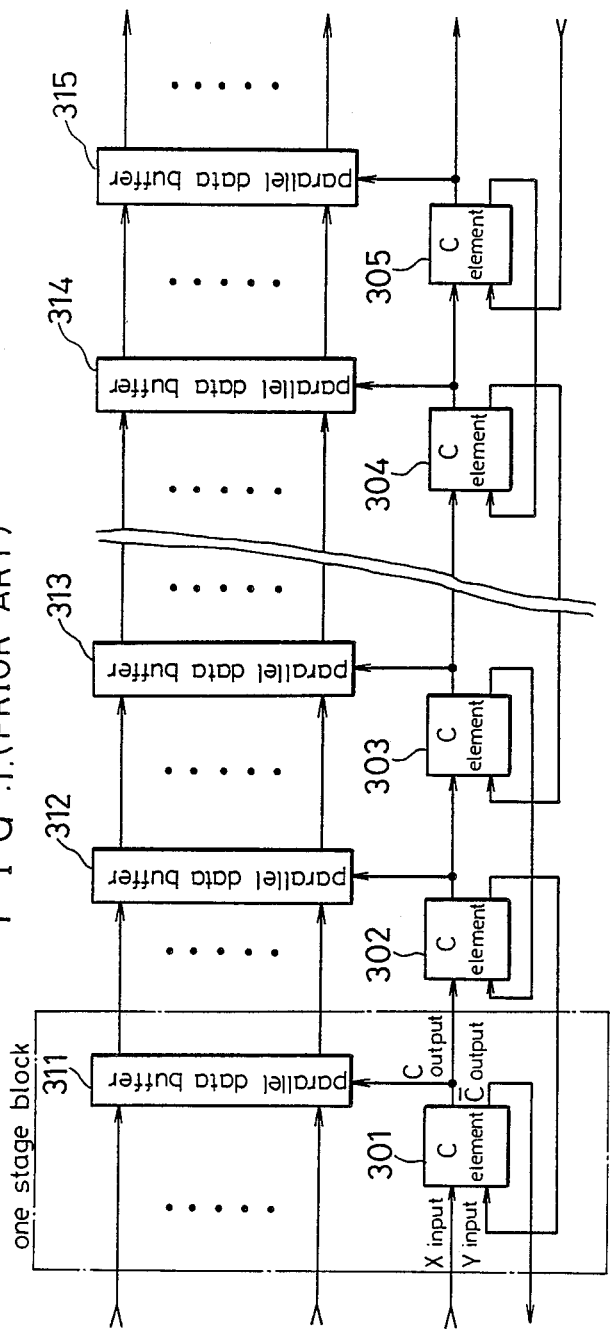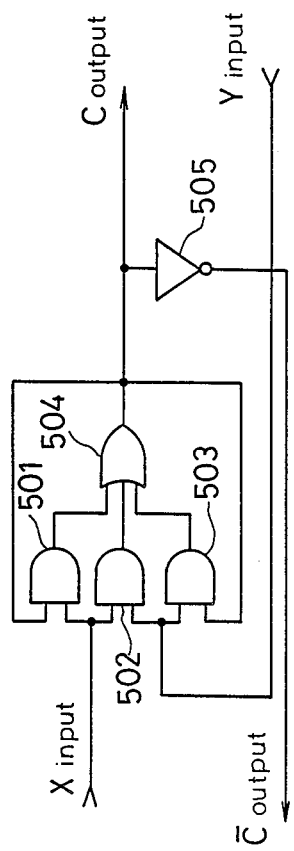

F I G .9.
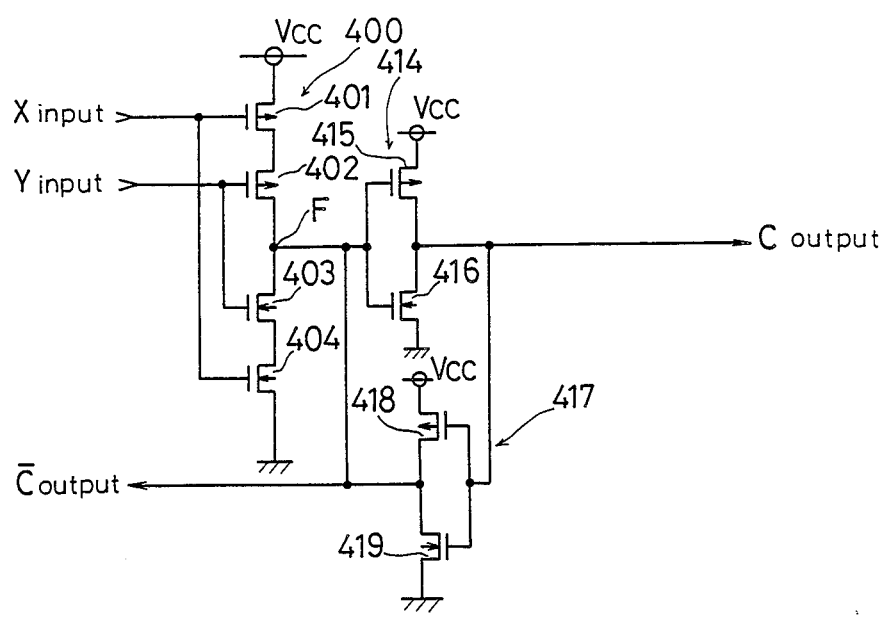

F I G .14.
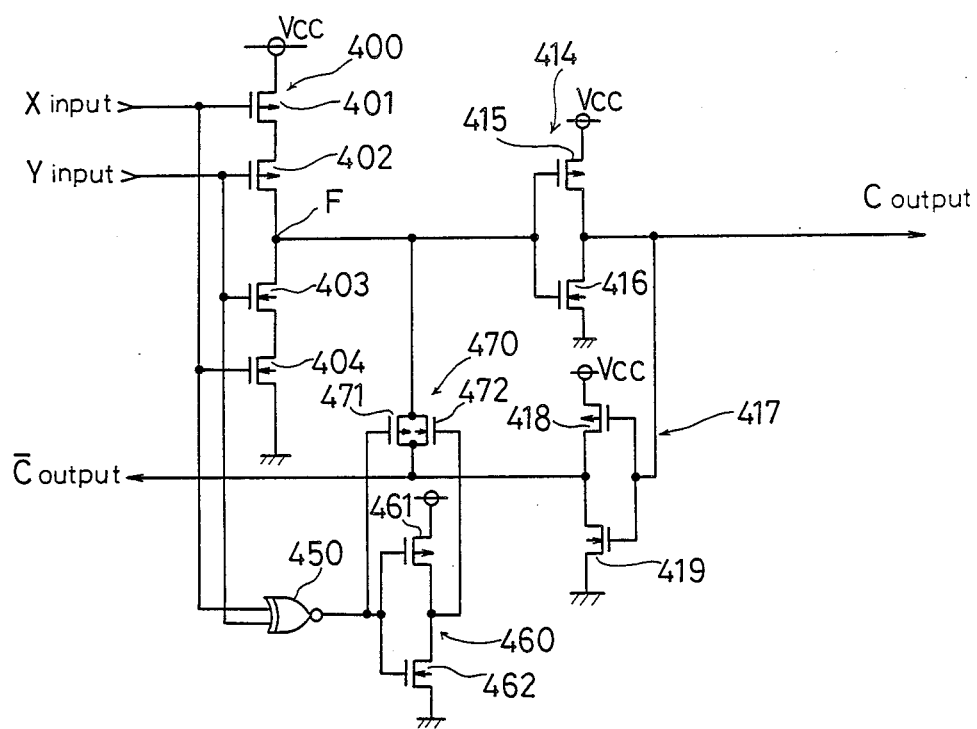

COINCIDENCE ELEMENT AND A DATA TRANSMISSION PATH

FIELD OF THE INVENTION

The present invention relates to a coincidence element responsive to a plurality of input signals for outputting the logical level of the input signals when the plurality of input signals coincide with each other, and a data transmission path in an asynchronous self running system in which that coincidence element is used as a transfer control circuit for the data transmission path.

BACKGROUND OF THE INVENTION

Generally, a coincidence element (hereinafter referred to as "C element") is a logical circuit which is responsive to two inputs X and Y for outputting a C or $\overline{C}$ signal in accordance with the Logic Value Table shown below. That is, the coincidence output C becomes the same level as that of the input signals when the two input signals X and Y coincide with each other, and it keeps the previous state when the two inputs X and Y are different from each other.

Such a C element is, for example, used for the transmission of transfer control pulses of an asynchronous self running shift register. Herein, an asynchronous self running shift register is one operating in such a manner that the push-in and pop-out of the data are conducted independently and simultaneously. The pushed-in data is automatically shifted towards the output without the use of shift clocks on a condition that the next stage shift register is not occupied. Such an asynchronous self running shift register functions so as to buffer data, and it can be used to connect two asynchronous systems.

| Logic Value Table | | | |
|---|---|---|---|
| INPUT | | OUTPUT | |
| X | Y | C | $\overline{C}$ |
| 0 | 0 | 0 | 1 |
| 0 | 1 | HOLD | HOLD |
| 1 | 0 | HOLD | HOLD |
| 1 | 1 | 1 | 0 |

The construction and the operation of a data transmission path comprising an asynchronous self running shift register will be described with reference to FIG. 1.

Each stage of the asynchronous self running shift register is constructed by a parallel data buffer and a transfer control circuit for controlling the opening or closing of the parallel data buffer in accordance with a control signal, and a C element is used as the transfer control circuit.

This C element opens the gate of the parallel data buffer that is provided corresponding to this C element when its C output (control signal) is 1, and the parallel data buffer receives the data transmitted from the prior stage, and holds the effective data. The C element does not open the gate of the parallel data buffer that is provided corresponding to the C element when its C output is 0, and the parallel data buffer does not receive the data from the prior stage, and does not hold the effective data. In other words, only the parallel data buffer corresponding to the C element whose C output is 1 holds the effective data, and the parallel data buffer corresponding to the C element whose C output is 0 does not hold the effective data. Herein, the C output of the C element of a particular stage is connected to the X input of the C element of the next stage, and the $\overline{C}$ output of the C element is connected to the Y input of the C element of the prior stage.

The device of FIG. 1 will be operated as follows.
Supposing that the C outputs of all the C elements 301 to 305 are 0, and the $\overline{C}$ outputs thereof are 1 at the initial state. When 1 is input to the X input of the C element 301 from the input at the left end of FIG. 1 and at the same time a data is given to the input terminal of the parallel data buffer 311, and the C output of the first C element 301 changes to 1 because both of two inputs thereof become 1, the data given to the input terminal of the parallel data buffer 311 is received thereby. Similarly as above, the C element at the second stage and that at the stage subsequent thereto receive the C output 1 of its prior stage C element, and change the C and $\overline{C}$ output of itself to 1 and to 0, respectively, thereby opening the gate of the parallel data buffer of that stage to make the parallel data buffer hold the data transmitted from the prior stage. Next, when 0 is input to the X input of the C element 301 from the input terminal at the left end of FIG. 1, the C and $\overline{C}$ output of the C element becomes 0 and 1, respectively, in turn from the left end because the Y inputs of the C elements 301 to 305 are all 0.

When a pulse signal is given to the X input of the C element 301 at the left end of the shift register and a data is input to the parallel data buffer 311 at the left end while the pulse signal is 1 as described above, the data is pushed in into the shift register. The signal 1 input to the X input of the C element 301 is transmitted to the right from the left together with the input data as shown in FIG. 1. Besides, when the level of the signal input to the X input of the C element 301 is changed to 0 from 1, the signal level 0 is transmitted from the left to the right. However, when the initial value of the C output of the right end C element 305 is 0, the C output of the C element 305 is kept 0 regardless of the fact that the X input thereof is changed to 1 caused by that the C output of the prior stage is changed to 1. Then, the Y input of the C element 304 at its prior stage is 1, and therefore, the output of the C element 304 is kept 1 with no change regardless of the fact that the C output of the prior stage C element 303 is transmitted to that stage. Accordingly, the signal level 0 of the C output of the C element does not outrun 1, or make the 1 forfeit.

As described above, when a push-in operation from the left end shift register is conducted by keeping the Y input of the right end C element 305 0, the outputs of the C elements become 0, 1, 0, 1, . . . , respectively, from the right end C element 305 towards leftwards. Furthermore, when the Y input of the right end C element 305 is changed to 1, the C output of the right end C element 305 is changed to 1 because the two inputs of the right end C element 305 become 1, and the C outputs of the C elements becomes in turn 1, 0, 1, 0, 1, . . . , respectively, from the right end, and the first word data which is pushed into the shift register from the left end is output at the output terminal of the parallel data buffer 315. In this way, the data pushed into the shift register from the left end parallel data buffer 311 is popped out by applying pulse signals to the Y input of the right end C element 305.

In the above description, the push-in operation and the pop-out operation are described distinctly from each other for simplification, but both operations can be conducted at the same time. This means that this asynchronous self running shift register has the same data buffering function as that of an asynchronous FIFO (first-in first-out) memory, and the push-in and the pop-out operation can be conducted by applying pulse signals to the X input of the right end C element 301 and to the Y input of the right end C element 305, respectively.

Conventionally, a C element constituted by logic gates, which is described in an article "An Elastic Memory Device Comprising a Non-synchronous Delay Line", recited in Journal of Electronics and Communication Society, November 1967, pp 84 to 91, is generally used as a transfer control circuit in a data transmission path.

FIG. 2 shows a construction of one stage of the C element shown in FIG. 5 of the above-described article. In FIG. 2, the reference numerals 501 to 503 designate two input AND gates, the reference numeral 504 designates a three input OR gate, and the reference numeral 505 designates an inverter.

The device will be operated as follows.

When the two inputs X and Y are both 1, the output of the AND gate 502 becomes 1, the output of the OR gate 504 becomes 1, and thus 1 and 0 are output at the C and $\overline{C}$ output, respectively. When the both of the two inputs X and Y are 0, the outputs of the AND gates 501 to 503 become all 0, the output of the OR gate 504 becomes 0, and thus 0 and 1 are output at the C and $\overline{C}$ output, respectively. Furthermore, when 1 and 0 are input at the X and Y input, respectively, with the C output before the signals X and Y are input being A (1 or 0), the outputs of the AND gate 502 and 503 become 0, the output of the AND gate 501 becomes A (1 or 0), the output of the OR gate 504 becomes A, and thus the C and $\overline{C}$ output become A and $\overline{A}$, respectively, holding the previous states. The operation of the device when the inputs X and Y are 0 and 1, respectively, is similar as that when the inputs X and Y are 1 and 0, respectively.

The conventional C element with such a construction, has a disadvantage in that it should have a large number of gate stages, leading to a long transmission delay when it is constituted by CMOS logic gates for the purpose of reducing the power consumption. Furthermore, when this C element is used as a transfer control circuit in a data transmission path, the circuit size of the data transmission path becomes large, and the speed of data transmission becomes low.

SUMMARY OF THE INVENTION

An object of the present invention is to provide an improved C element and a data transmission path using the C element capable of reducing the power consumption as well as minimizing the circuit size and the transmission delay of the data transmission path.

A second object of the present invention is to provide an improved C element which is not easily affected by noise and has a reduced transient current.

A third object of the present invention is to provide an improved C element which is not easily affected by noise, has a reduced transient current, and has a high pulse transmission speed.

A fourth object of the present invention is to provide a data transmission path which has a highly noise proof transfer control circuit and is capable of conducting high speed data transmission with no loss of data.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a coincidence element responsive to a plurality of input signals for outputting the level of the input signals when said plurality of input signals coincide with each other, which comprises: a serial connection of a first electrically conductive type and a second electrically conductive type MOS transistors, the number transistors of each type being equal to the number of the input signals, responsive to said plurality of inputs connected between a first power supply and a second power supply; and a CMOS inverter responsive to an intermediate output at the connection of the lowermost stage of the first conductivity type MOS transistors and the most upper stage second conductivity type MOS transistors for outputting a coincidence signal.

BRIEF DESCRIPTION OF THE DRAWINGS

FIG. 1 is a block diagram showing a prior art data transmission path;

FIG. 2 is a circuit diagram showing a prior art C element;

FIG. 9 is a circuit diagram showing a C element as a fifth embodiment of the present invention;

FIG. 14 is a circuit diagram showing a C element as a tenth embodiment of the present invention;

DETAILED DESCRIPTION OF THE PREFERRED EMBODIMENTS

Figure 3:
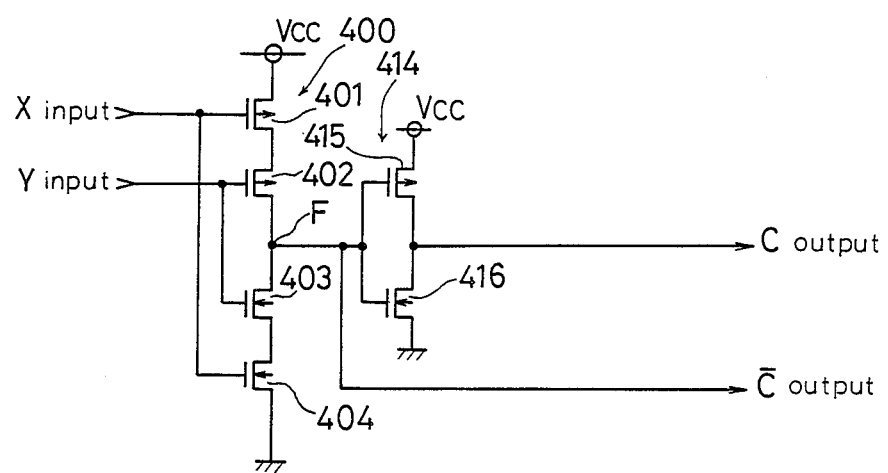
FIG. 3 is a circuit diagram showing a C element as a first embodiment of the present invention.

In order to explain the present invention in detail, reference will be particularly made to FIG. 3.

FIG. 3 shows a C element as a first embodiment of the present invention. In FIG. 3, the reference numeral 400 designates a serial connection of two P-channel (first conductivity type) MOS transistors 401 and 402 and two N-channel (second conductivity type) MOS transistors 403 and 404 connected between the power supply Vcc and ground. The reference numeral 414 designates a CMOS inverter responsive to the intermediate output $\overline{C}$ from the node F which is a connecting node of the MOS transistors 402 and 403 for outputting a coincidence signal C. In this CMOS inverter 414, the reference numeral 415 designates a P-channel MOS transistor, and the numeral 416 designates an N-channel MOS transistor.

The device will be operated as follows.

When the X and Y inputs are both 0, the transistors 401 and 402 are turned ON and the transistors 403 and 404 are turned OFF to make the node F equal 1, and the $\overline{C}$ and C outputs become 1 and 0, respectively. When the X and Y inputs are both 1, the transistors 403 and 404 are turned ON and the transistors 401 and 402 are turned OFF to make the node F equal 0, and the $\overline{C}$ and C outputs become 0 and 1, respectively. When the X and Y inputs are 0 and 1, respectively, the transistors 401 and 403 are turned ON and the transistors 402 and 404 are turned OFF to place the node F into a floating state. Accordingly, the node F keeps the voltage it had before the X and Y inputs become 0 and 1, respectively. When the X and Y inputs are 1 and 0, respectively, the transistors 402 and 404 are turned ON and the transistors 401 and 403 are turned OFF to place the node F into a floating state similarly as the above case where the X and Y inputs are 0 and 1, respectively, thereby keeping its previous state.

In this way, only six transistors are used to constitute a C element by utilizing the characteristics of the CMOS circuit, and the number of gate stages and the transmission delay are reduced to a great extent as compared with the conventional one in which the logic of the C element is realized by using standard CMOS gates.

Figure 4:
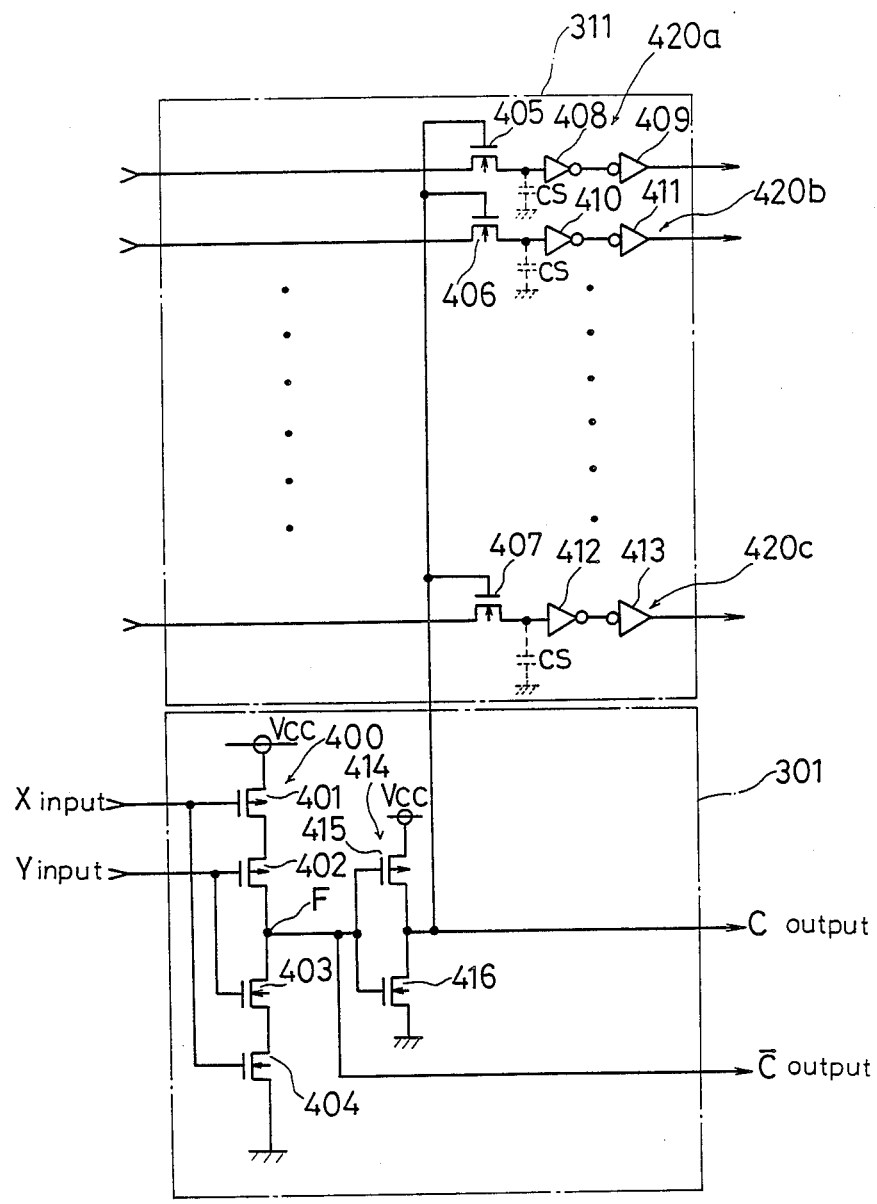
FIG. 4 is a block diagram showing a data transmission path as a second embodiment of the present invention.

FIG. 4 shows a data transmission path as a second embodiment of the present invention. In FIG. 4 the same reference numerals are used to designate the same or corresponding elements as shown in FIG. 3. The reference numerals 420a to 420c each designate a one bit latch constituting a parallel data buffer (data latch) 311. The reference numerals 405 to 407 each designate an N-channel MOS transistor, and the reference numerals 408 to 413 each designate an inverter.

The device will be operated as follows.

In this data transmission path, using the above-described C element as a transmission control circuit, the circuit size as well as the power consumption is reduced to a great extent. Furthermore, the data can be transmitted asynchronously at a high speed because the transfer delay of the transmission control pulse is short.

Figure 5:
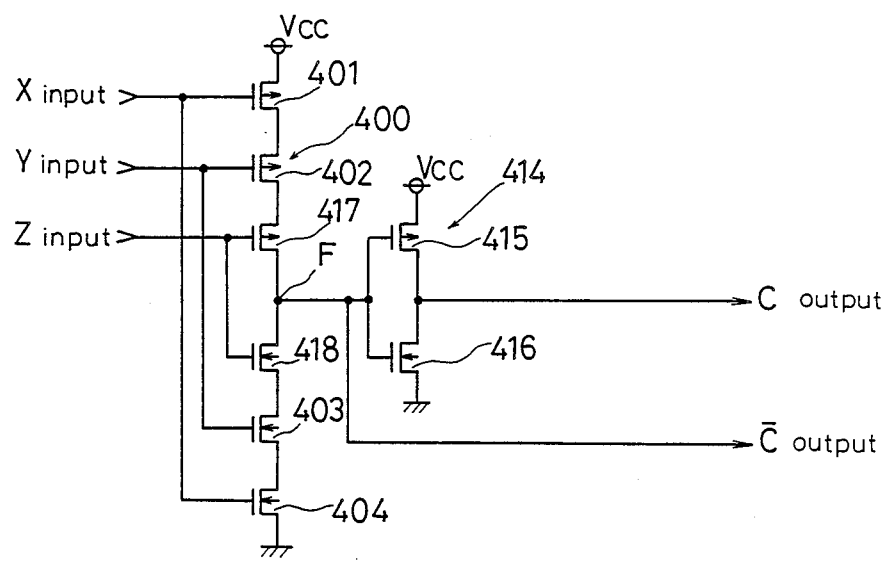
FIG. 5 is a circuit diagram showing a C element as a third embodiment of the present invention.

Although the C element of the embodiment of FIG. 3 has only two inputs a C element having more than two inputs is, of course, easily constituted by increasing the number of the P and N channel MOS transistors constituting a serial connection. FIG. 5 shows a three input C element as a third embodiment of the present invention. In FIG. 5, the reference numerals 417 and 418 designate a newly added P and N channel MOS transistor, respectively, constituting the serial connection 400 along with the MOS transistors 401, 402 and 403, 404. Such a multiple input C element can be applied to a junction section of two data transmission paths as shown in FIG. 6.

Figure 6:
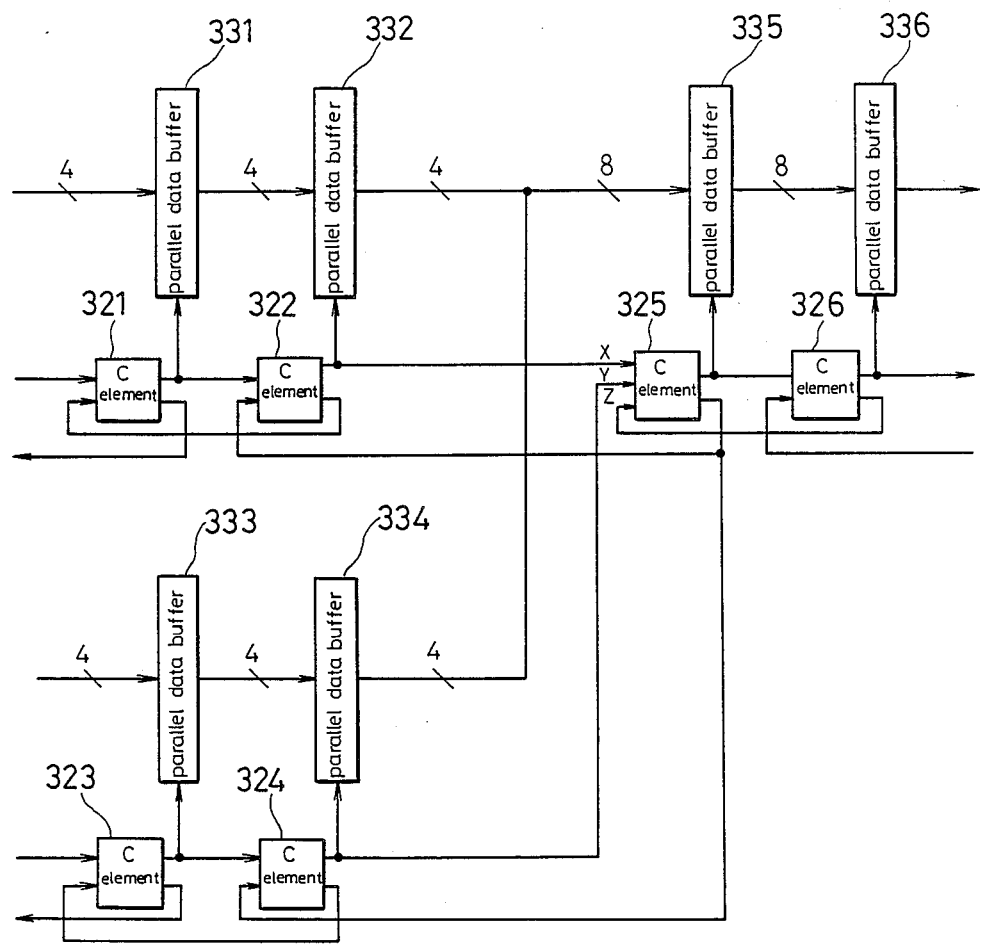
FIG. 6 is a block diagram showing a data transmission path as a fourth embodiment of the present invention which is provided with the C element of FIG. 5.

FIG. 6 shows a junction section of two data transmission paths as a fourth embodiment of the present invention. In this junction section when data arrive at the upper data transmission path and at the lower data transmission path and the second stage parallel data buffer 336 after the junction point is empty, the three inputs X, Y, and Z of the one prior stage C element 325 become all 1, and each 4 bit data on the data transmission path will be merged to produce 8 bit data. In FIG. 6 the reference numerals 331 to 334 designate 4 bit parallel data buffers, the numerals 335 and 336 designate 8 bit parallel data buffers, and the numerals 321 to 324 and 326 designate two input C elements.

In the embodiment shown in FIG. 4 each latch is constituted by two inverters and a MOS transistor, but a CMOS transfer gate can be used instead of this MOS transistor with the same effects as described above.

Figure 7:
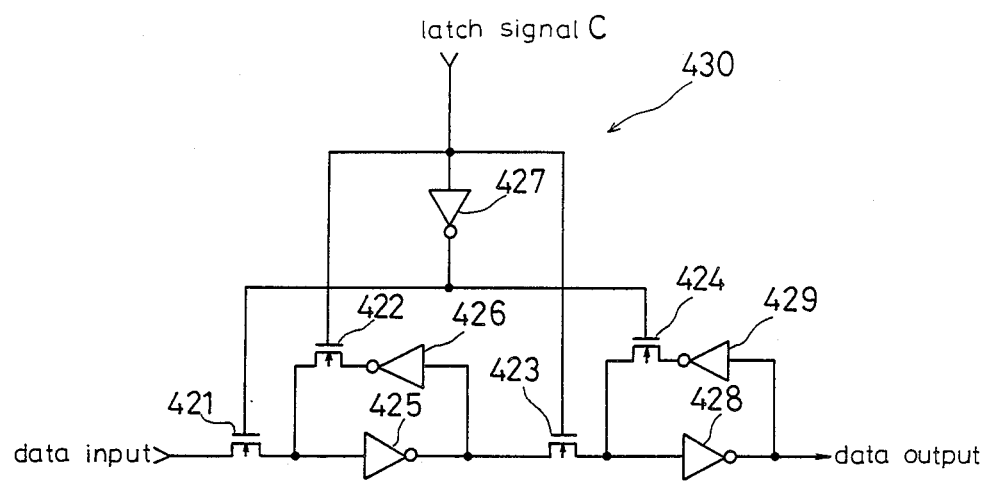
FIGS. 7 and 8 are circuit diagrams showing other examples of the latch of the parallel data buffer of FIG. 4.
Figure 8:
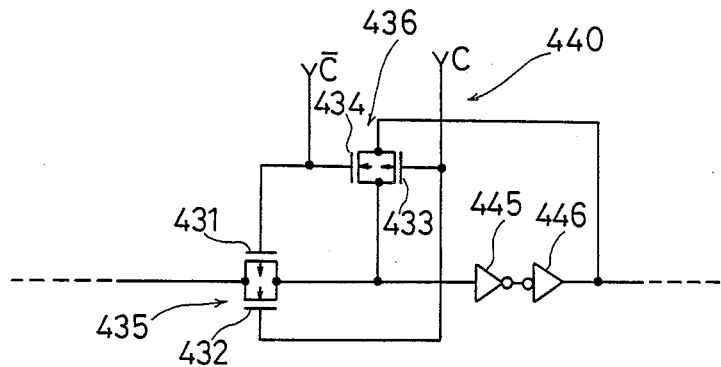

In the embodiment of FIG. 4, a dynamic latch which holds the data by only a stray capacitor CS is used as a parallel data buffer, but an edge trigger type latch 430 shown in FIG. 7 or a transparent latch 440 shown in FIG. 8 can be used as a parallel data buffer with the same effects as described above.

In FIG. 7, the reference numerals 425 to 429 designate inverters, the numerals 421 to 424 designate N-channel MOS transistors, and these MOS transistors can be replaced by CMOS transfer gates. In FIG. 8, the reference numerals 445 and 446 designate inverters, the numerals 435 and 436 designate CMOS transfer gates comprising P and N channel MOS transistors 431 and 432, and P and N channel MOS transistors 433 and 434, respectively.

In the C element of the above-described first embodiment, however, the intermediate output when the two inputs are different from each other is varied dependent on the stray capacity. This means that this C element may be affected by noise, and the output level thereof will decay with the passage of time. Furthermore, when the time period while the two inputs of the C element coincide with each other is short, the level of the intermediate output is in a floating state for a comparatively long time until it becomes completely 1 or 0, whereby the output level becomes an intermediate value between 1 and 0, and a transient current flows through the CMOS inverters.

Furthermore, in the data transmission path of the second embodiment utilizing the C element as a transfer control circuit, the data of one stage may be forfeited because the transfer control pulse is changed. This is caused by noises when data are stored in the parallel data buffer over a plurality of stages. Furthermore, there is also a disadvantage in that the power consumption is large caused by the transient current.

FIG. 9 shows a C element as a fifth embodiment of the present invention. In FIG. 9, the same reference numerals as those shown in FIGS. 3 and 4 are used to designate the same or corresponding elements. The reference numeral 417 designates a second CMOS inverter responsive to the output of the CMOS inverter 414 (coincidence output) for outputting an inverted signal of the coincidence output and feeding back the same to the node F (intermediate output). In this embodiment the second CMOS inverter 417 is constituted by transistors 418 and 419 having a small driving ability when compared to that of the serial connection 400.

The device will be operated as follows.

The fundamental operation of this embodiment is the same as that of the first embodiment. However, in this fifth embodiment a latch structure is constituted by the first and the second CMOS inverters 414 and 417, and the C output of the first CMOS inverter 414 is fed back to the node F, inverted by the second CMOS inverter 417, and therefore the complete 1 or 0 is output as the C output. In other words, when the two inputs X and Y of the C element are different from each other the node F becomes a floating state, but in this embodiment, when the C output has a value relatively close to 1 (or 0) the output of the second CMOS inverter 417 becomes relatively close to 0 (or 1), and the C output rises up (falls down) to the complete 1 (or 0) level by the above-mentioned feedback operation, whereby a device which is not easily affected by noise and has no delay in its output level is obtained.

Furthermore, in the first embodiment, when the two inputs X and Y of the C element coincide with each other, the $\bar{C}$ signal is output from the node F before the level of the node F swings fully, thereby to making the node F an intermediate level between 1 and 0, whereby a transient current is flown through the CMOS inverter 414. But, in this embodiment, the level of the node F becomes the complete 0 or 1 by the newly added second CMOS inverter 417, and a transient current does not flow through the CMOS inverter 417, whereby power consumption is reduced to a greater extent.

The second stage CMOS inverter 417 is constituted by MOS transistors 418 and 419 having a small driving ability, that is, having a long gate length or a narrow channel width so as to avoid a transmission delay, which leads to a malfunction in the worst case. Such a transmission delay may arise when these driving abilities are equal to each other caused by the collision of the output of the serial connection 400 and the output of the CMOS inverter 417.

Figure 10:
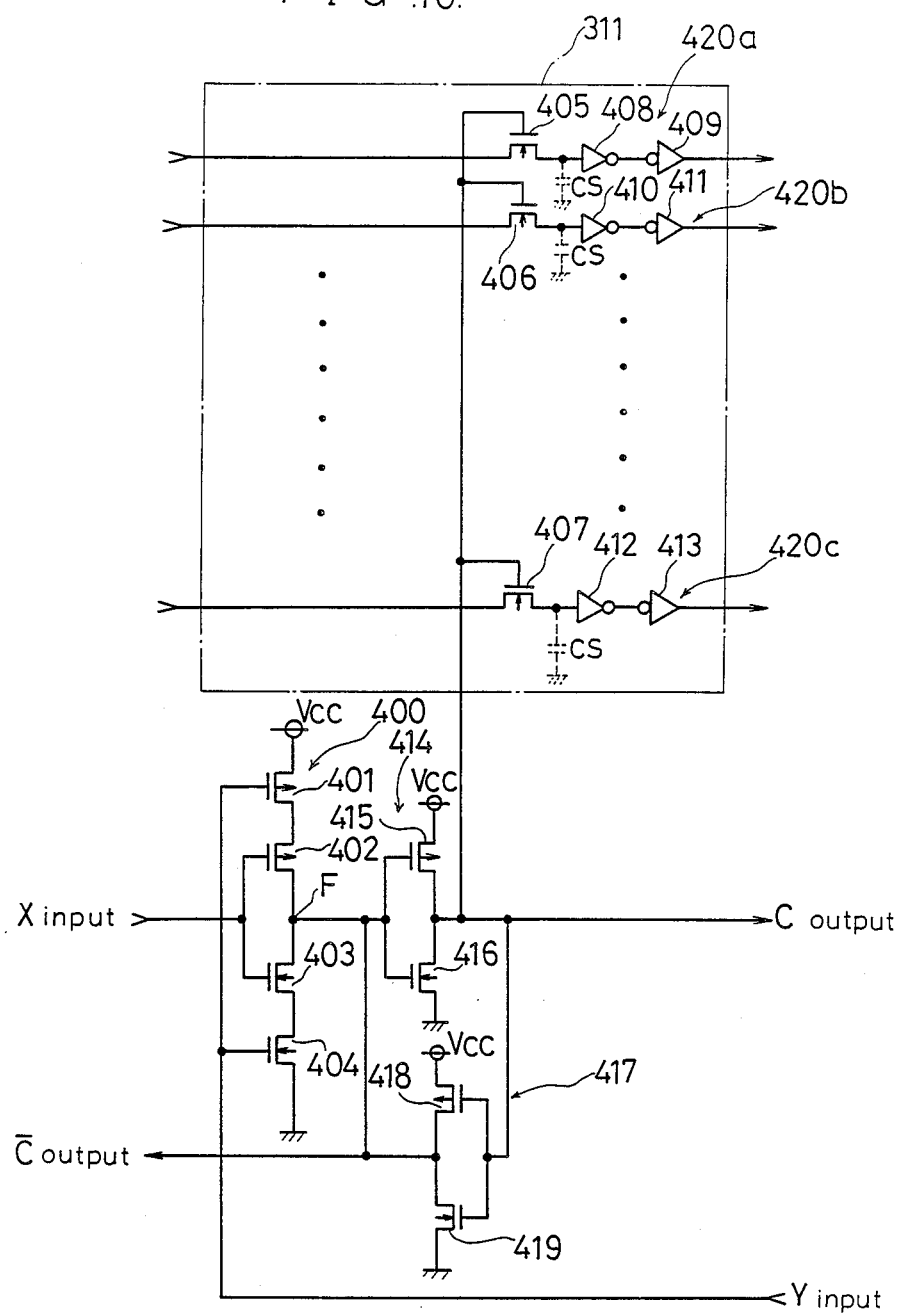
FIG. 10 is a block diagram showing a data transmission path as a sixth embodiment of the present invention.

FIG. 10 shows a data transmission path as a sixth embodiment of the present invention. In FIG. 10, the same reference numerals already used designate the same or corresponding elements. The numerals 420a to 420c designate a latch of one bit constituting a parallel data buffer (data latch). The reference numerals 405 to 407 designate N-channel MOS transistors. The reference numerals 408 to 413 designate inverters.

This data transmission path provided with a C element constituted as described above as a transfer control circuit is strong against noises, and does not cause a forfeiture of data stored in the parallel data buffer. Furthermore, a transient current does not flow through the CMOS inverter of the C element, whereby the power consumption is reduced to a great extent.

Figure 11:
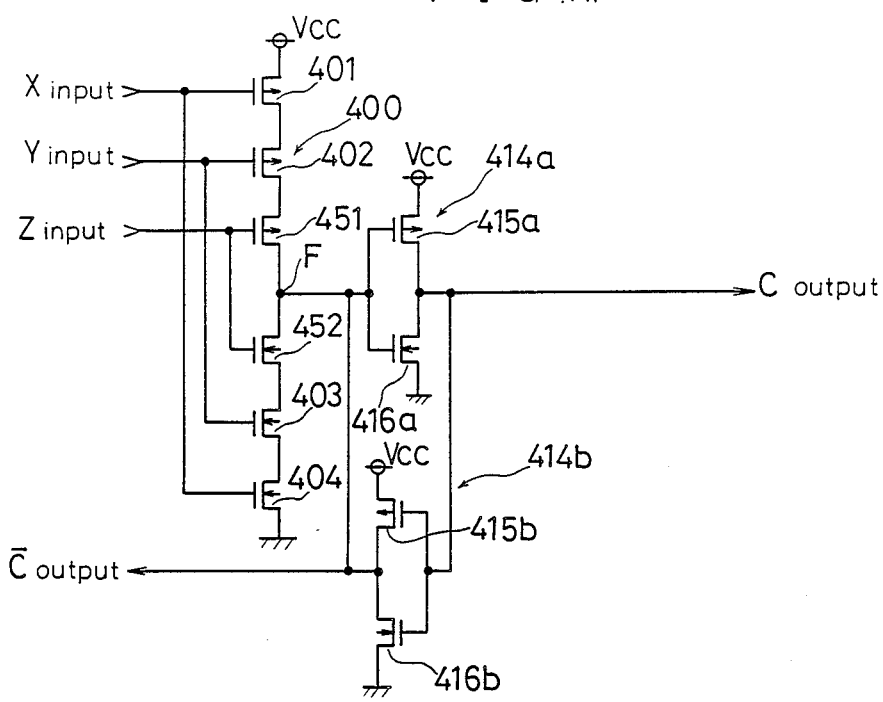
FIG. 11 is a circuit diagram showing a C element as a seventh embodiment of the present invention.

In the fifth embodiment a two input C element is described, but a C element having more than two inputs can be easily constituted by increasing the number of the P and N channel MOS transistors constituting a serial connection. FIG. 11 shows a three input C element as a seventh embodiment of the present invention. In FIG. 7, the reference numerals 451 and 452 designate newly added P and N channel MOS transistors constituting the serial connection 400 together with the MOS transistors 401 and 402, and 403 and 404. Such a multiple input C element can be applied to a junction section is a manner similar to that described above with reference to FIG. 6.

Figure 12:
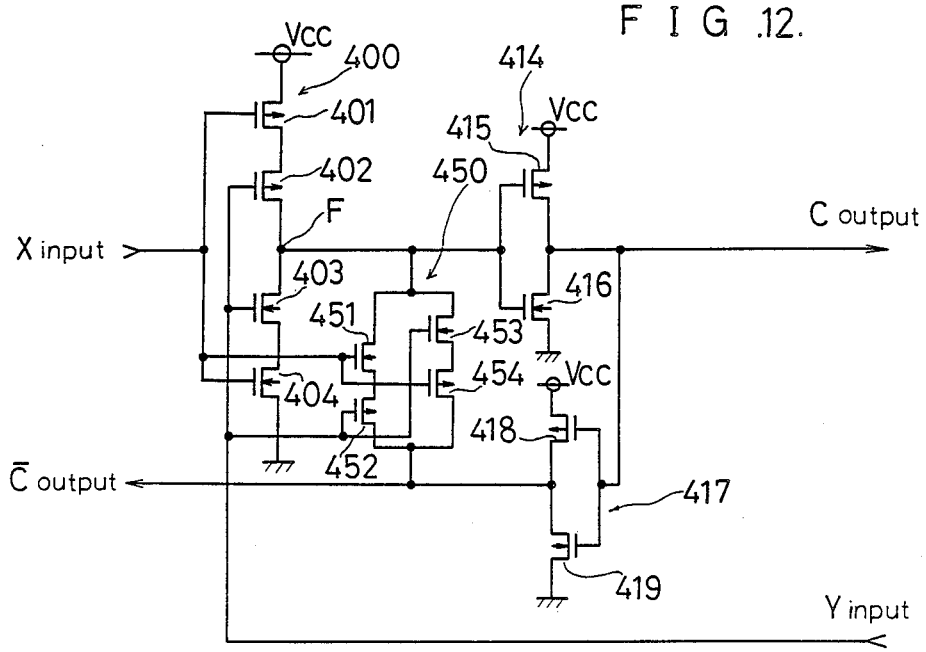
FIG. 12 is a circuit diagram showing a C element as an eighth embodiment of the present invention.

FIG. 12 shows a C element as an eighth embodiment of the present invention. In FIG. 12, the same reference numerals already used designate the same or corresponding elements. The numeral 417 designates a second CMOS inverter constituted by a P-channel MOS transistor 418 and a N-channel MOS transistor 419. This second CMOS inverter 417 is responsive to the output of the first CMOS inverter 414 for outputting an inverted signal thereof and feeding back the same to the node F (intermediate output). The reference numeral 450 designates a latch circuit constituted by the first and the second CMOS inverters 414 and 417 only when the two inputs X and Y of the C element do not coincide with each other. In this circuit 450, the reference numerals 451 and 453 designate N-channel MOS transistors, and the reference numerals 452 and 454 designate P-channel MOS transistors.

The fundamental operation of this eighth embodiment is the same as that of the fifth embodiment. In this embodiment, however, a latch structure is constituted by the CMOS inverters 414 and 417 by either the path comprising the transistors 451 and 452 or the path comprising the transistors 453 and 454 of the latch circuit constituting circuit 450 being turned ON and the output of the second CMOS inverter 417 being transmitted to the node F only when the two inputs X and Y do not coincide with each other. Therefore, a complete 1 or 0 is output as the C output.

In other words, only when the node F becomes a floating state, caused by the fact that the two inputs X and Y of the device are 0 and 1, or 1 and 0, respectively, are either of the two paths in the latch circuit constituting circuit 450 turned ON thereby transmitting the output of the second CMOS inverter 417 to the node F. The operation thereafter of this eighth embodiment is the same as that of the fifth embodiment, and accordingly, a device which is strong against noises and has no deterioration in its output level is obtained similarly as the fifth embodiment.

Furthermore, in this eighth embodiment when the two inputs X and Y of the C element coincide with each other the path comprising the MOS transistors 451 and 452 and the path comprising the MOS transistors 453 and 454 of the latch circuit constituting circuit 450 are both cut off, and the output of the serial connection 400 and the output of the second CMOS inverter 417 do not collide with each other, whereby a transmission delay caused by the collision is prevented.

Figure 13:
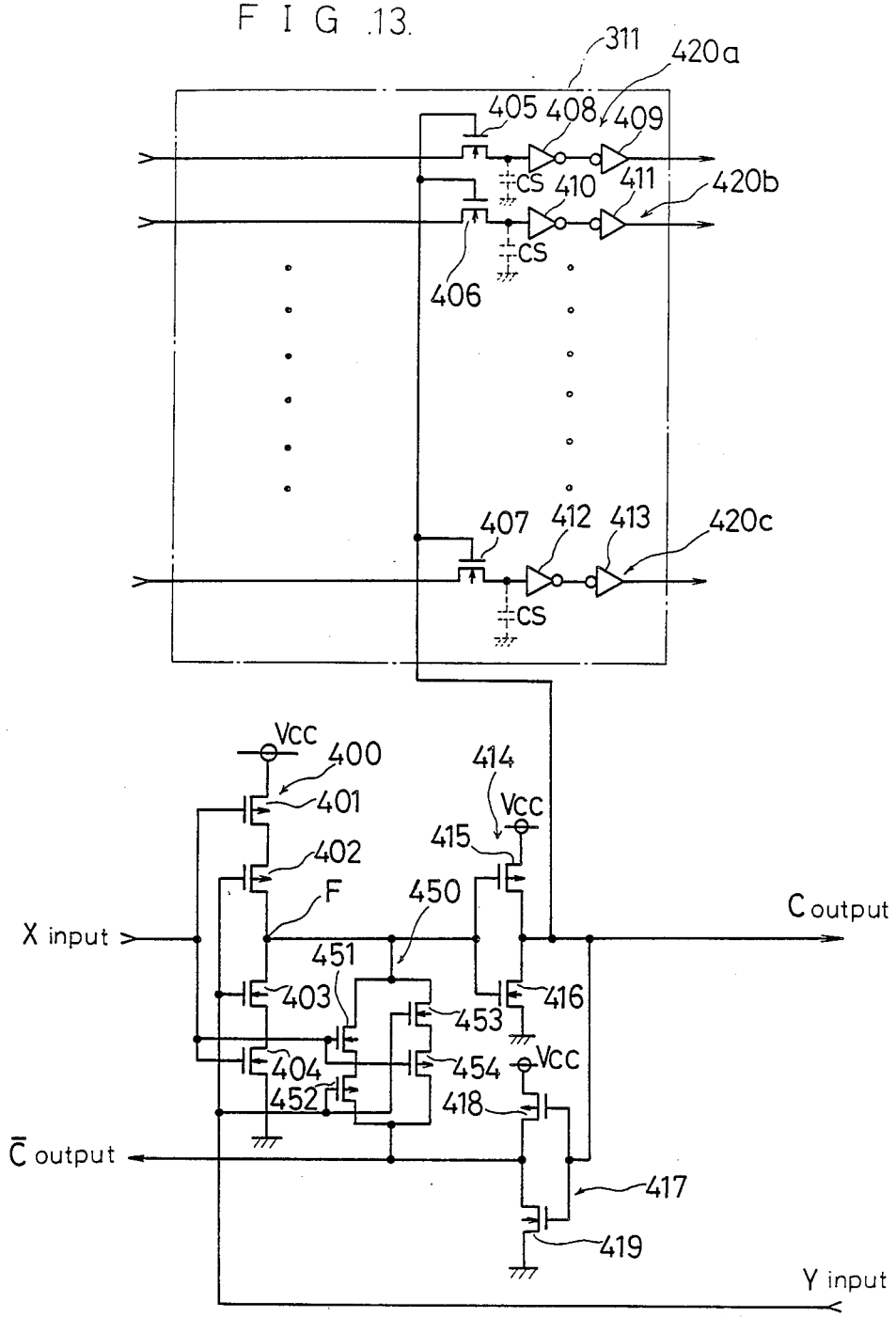
FIG. 13 is a block diagram showing a data transmission path as a ninth embodiment of the present invention.

FIG. 13 shows a data transmission path as a ninth embodiment of the present invention. In FIG. 13, the same reference numerals already used designate the same or corresponding elements. The reference numerals 420a to 420c designate a latch of one bit constituting a parallel data buffer (data storage means) 311. The reference numerals 405 to 407 designate N-channel MOS transistors, and the reference numerals 408 to 413 designate inverters.

The data transmission path of this ninth embodiment provided with a C element constituted as described above as a transfer control circuit is not easily affected by noise, a forfeiture of data stored in the data latch is not likely to arise, and the power dissipation in this ninth embodiment is reduced to a greater extent because a transient current does not flow through the CMOS inverters of the C element as it might through the sixth embodiment. Furthermore, in this ninth embodiment, the collision of the output of the serial connection and that of the first CMOS inverter is prevented because the feedback by the latch is cut off while the node F of the C element is driving the next stage, whereby the transmission speed of the transfer control pulse is enhanced.

FIG. 14 designates a C element as a tenth embodiment of the present invention. In FIG. 14, the same reference numerals already used designate the same or corresponding elements. The reference numeral 417 designates a second CMOS inverter constituted by a P-channel MOS transistor 418 and an N-channel MOS transistor 419. This second CMOS inverter 417 is responsive to the output of the first CMOS inverter 414 for outputting an inverted signal thereof and feeding back the same to the node F (intermediate output). The reference numeral 450 designates an inverted type exclusive OR circuit for detecting the coincidence of the two inputs X and Y of the C element. The numeral 470 designates a CMOS transfer gate provided between the output of the second CMOS inverter 417 and the node F. This CMOS transfer gate 470 is constituted by a P-channel MOS transistor 471 and an N-channel MOS transistor 472. The reference numeral 460 designates a third CMOS inverter responsive to the output of the exclusive OR circuit 450 for outputting an inverted signal thereof. This third CMOS inverter 460 is constituted by a P-channel MOS transistor 461 and an N-channel MOS transistor 462.

The device will be operated as follows.

The fundamental operation of this embodiment is the same as that of the first embodiment. In this tenth embodiment, however, the CMOS transfer gate 470 is turned ON by the exclusive OR circuit 450 and the third CMOS inverter 460 only when the two inputs X and Y do not coincide with each other, and thus a latch structure is constituted by the first and the second CMOS inverters 414 and 417. Accordingly, a complete 1 or 0 is output as the C output.

In other words, only when the node F becomes a floating state due to the fact that the two inputs X and Y of the device are 0 and 1, or 1 and 0, respectively, the CMOS transfer gate 470 is turned ON and thereby transmits the output of the second CMOS inverter 417 to the node F. The operation thereafter of this tenth embodiment is the same as that of the fifth embodiment, and accordingly, a device which is not easily affected by noise and has no decay in its output level is obtained similar to the fifth embodiment.

Furthermore, in this tenth embodiment, because a CMOS transfer gate is adopted to transmit the output of the CMOS inverter 417 to the node F, the output of the inverter 417 is transmitted to the node F without falling a value less than 1 (or without rising to a value larger than 0), and accordingly the node F does not become an intermediate voltage even by this transmission, whereby a transient current does not flow through the CMOS inverter 414.

Furthermore, when the two inputs X and Y of the C element coincide with each other the output of the inverting type exclusive OR circuit 450 becomes 1, the output of the third CMOS inverter 460 becomes 0, and the CMOS transfer gate 470 is turned OFF. Accordingly, the output of the serial connection 400 and the output of the second CMOS inverter 417 do not collide with each other, whereby a transmission delay caused by such a collision is prevented.

Figure 15:
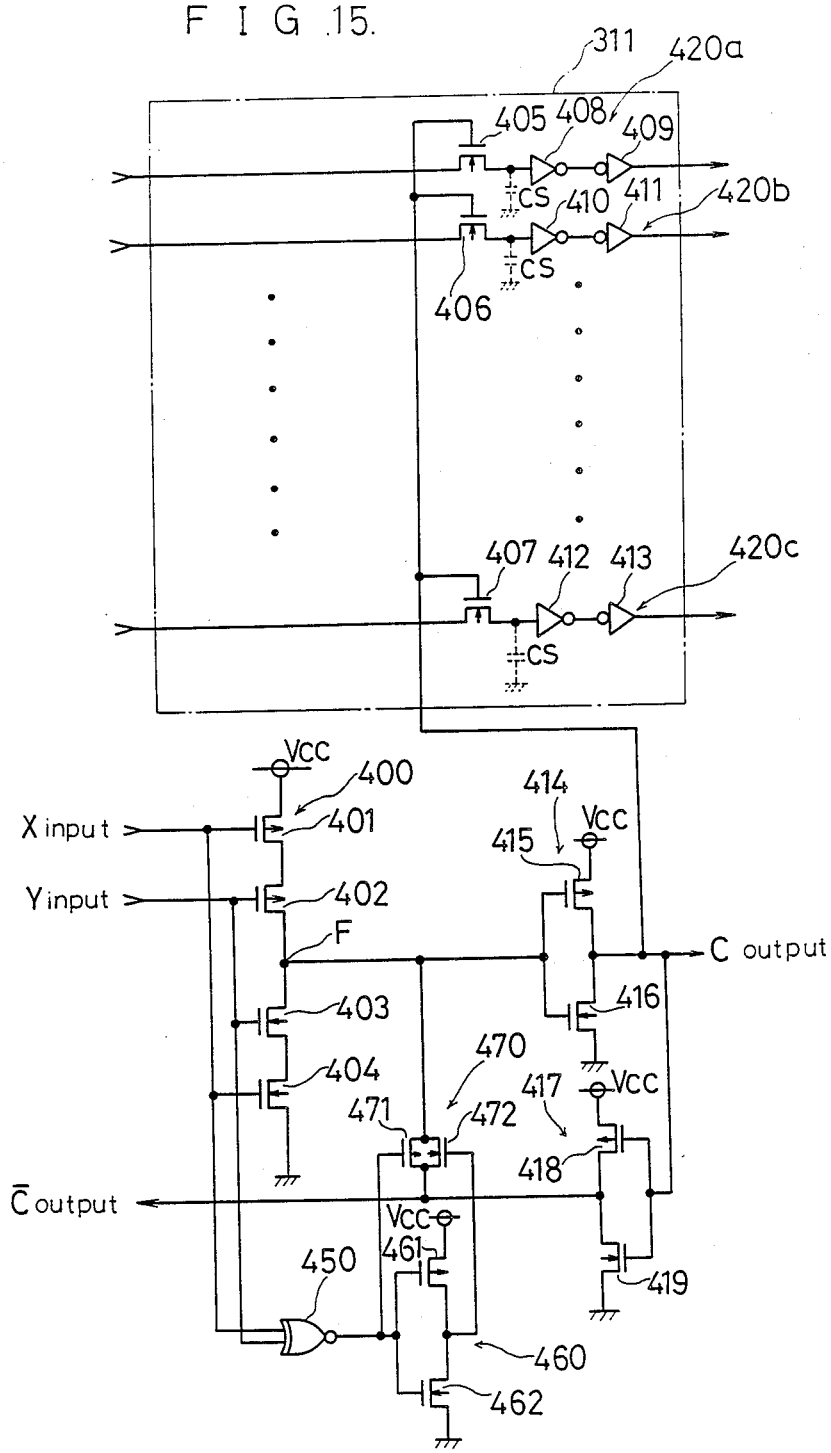
FIG. 15 is a block diagram showing a data transmission path as an eleventh embodiment of the present invention.

FIG. 15 shows a data transmission path as an eleventh embodiment of the present invention. In FIG. 15, the same reference numerals already used designate the same or corresponding elements. The reference numerals 420a to 420c designate a latch of one bit constituting the parallel data buffer (data storage means) 311. The reference numerals 405 to 407 designate N-channel MOS transistors. The reference numerals 408 to 413 designate inverters.

This data transmission path provided with a C element constituted as described above as a transfer control circuit has the same effects as those of the ninth embodiment.

Figure 16:
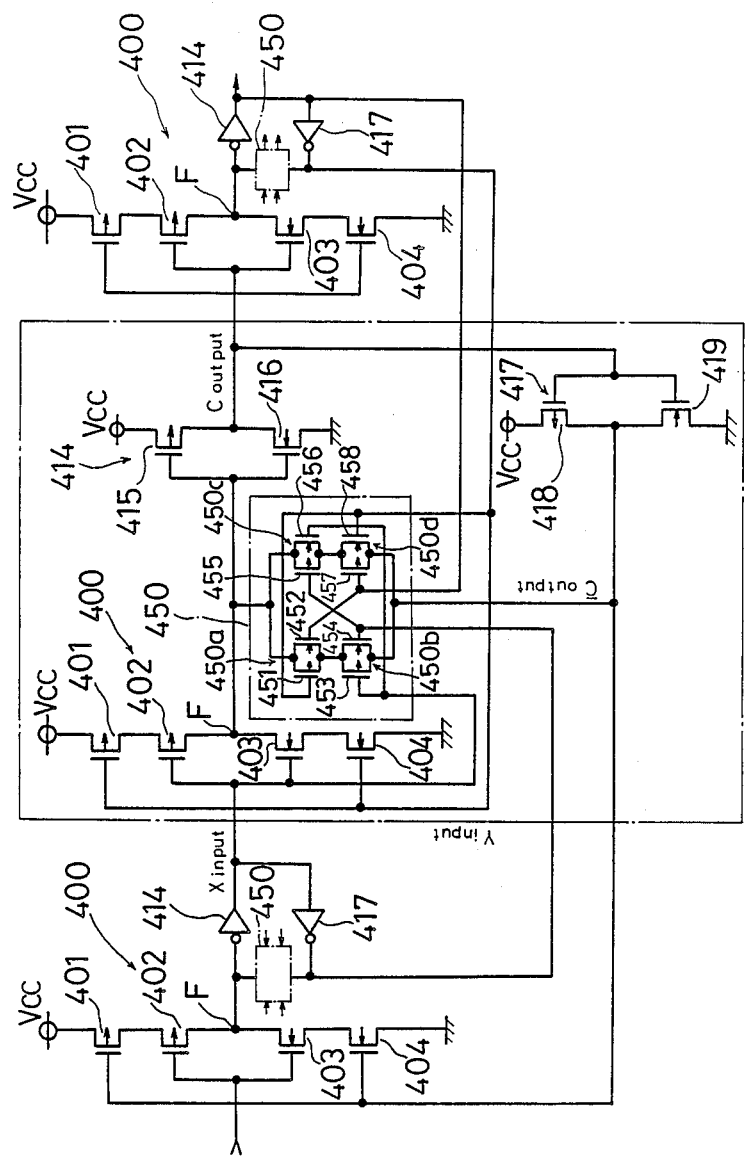
FIG. 16 is a circuit diagram showing a C element as a twelfth embodiment of the present invention.

FIG. 16 shows a C element as a twelfth embodiment of the present invention. In FIG. 16 the same reference numerals already used designate the same or corresponding elements. The reference numeral 417 designates a second CMOS inverter constituted by a P-channel MOS transistor 418 and an N-channel MOS transistor 419. This second CMOS inverter 417 is responsive to the output of the first CMOS inverter 414 for outputting an inverted signal thereof and feeding back the same to the node F (intermediate output). The reference numeral 450 designates a latch circuit for detecting the lack of coincidence of the two inputs X and Y and for feeding back the output of the CMOS inverter 417 to the node F only when the lack of coincidence is detected. This latch circuit is constituted by a parallel connection of a serial connection of two both channel transfer gates 450a and 450b and a serial connection of two CMOS transfer gates 450c and 450d. The reference numerals 451, 453, 455, and 457 designate P-channel MOS transistors, and the reference numerals 452, 454, 456, and 458 designate N-channel MOS transistors.

The fundamental operation of this embodiment is the same as that of the first embodiment. In this embodiment, however, a latch structure is constituted by the first and the second CMOS inverters 414 and 417 by the output of the second CMOS inverter 417 being transmitted to the node F by the latch circuit constituting circuit 410 only when the two inputs X and Y of the device do not coincide with each other, whereby a complete 1 or 0 is output as the C output.

In other words, when the node F becomes a floating state because the two inputs X and Y of the particular stage of the device are 0 and 1, or 1 and 0, respectively, the C output from the prior stage is 1 (or 0), and the C output from the latter stage is 1 (or 0), the CMOS transfer gates 450a and 450b (450c and 450d) are turned ON to transmit the output of the second CMOS inverter 417 to the node F, and the level of the node F at the floating state is not fixed completely. For example, when it has a value relatively close to 0 (or 1) the C output has a value relatively close to 1 (or 0), and thereafter the node F falls (or rises up) to the complete 0 (or 1) by the above-described feedback operation, and the C output rises up (or falls) to the complete 1 (or 0), whereby a device which is not easily affected by noise and has no decay in its output level is obtained.

Furthermore, it is judged as to whether the feedback transmission of the output of the CMOS inverter 417 to the node F should be conducted or not by the latch circuit 450 at a high speed, whereby the output of the second CMOS inverter 417 and the output of the serial connection 400 never collide with each other. Furthermore, the output of the second CMOS inverter 417 is transmitted by the CMOS transfer gates to the node F with no level change caused by a substrate effect, whereby a transient current does not flow through the CMOS inverter 414.

Furthermore, when the two inputs X and Y of the device coincide with each other, the path of the CMOS transfer gates 450a and 450b and that of those 450c and 450d are both cut off, and the output of the serial connection 400 and the output of the second CMOS inverter 417 do not collide with each other, whereby a transmission delay caused by the collision is prevented.

The device of this embodiment is less susceptible to noise than the other embodiments which hold the output by only the stray capacity, and the intermediate output or the coincidence output of the C element becomes completely 1 or 0. The transmission of the output of the second CMOS inverter 417 to the node F is judged and carried out by the CMOS transfer gates, thereby eliminating the time for decoding as to whether the transmission should be conducted or not, and the output of the second CMOS inverter is immediately transmitted to the node F with no level change caused by the substrate effect. Thus, only a short time is required for the signal level of the node F and the coincidence output to be fixed, and a transient current does not flow through the CMOS inverter 414.

Furthermore, in this twelfth embodiment the feedback of the output of the second CMOS inverter to the node F is immediately cut off when the two inputs of the C element coincide with each other, and the output of the serial connection and the output of the second CMOS inverter do not collide with each other, thereby resulting in no reduction in the transmission speed.

Figure 17:
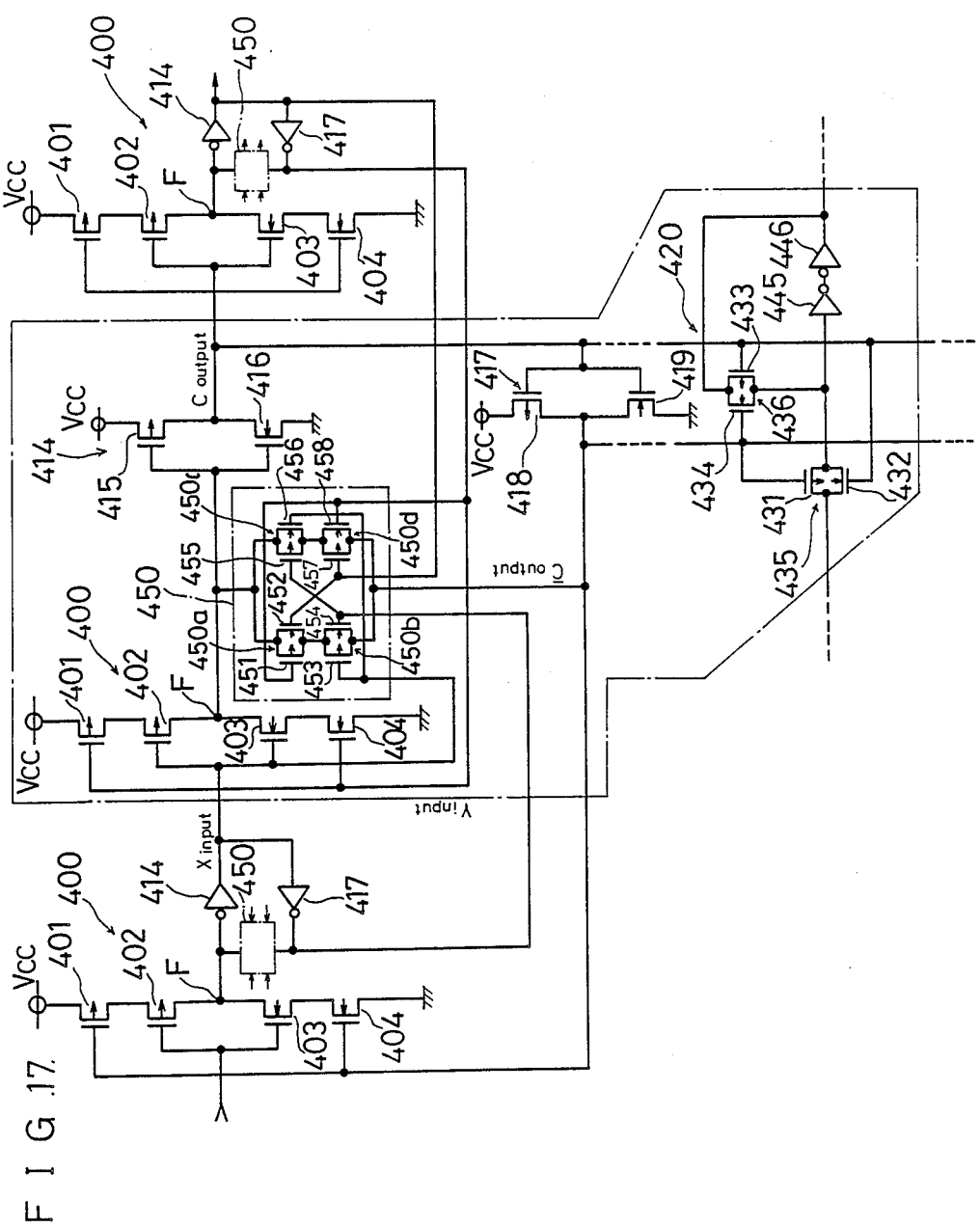
FIG. 17 is a block diagram showing a data transmission path as a thirteenth embodiment of the present invention.

FIG. 17 shows a data transmission path as a thirteenth embodiment of the present invention. In FIG. 17, the same reference numerals already used to designate the same or the corresponding elements. The reference numeral 420 designates a latch of one bit constituting the parallel data buffer (data latch) 311, and the reference numerals 445 and 446 designate inverters. The reference numerals 435 and 436 designate both channel transfer gates. The reference numerals 431 and 432, and 433 and 434 designate P-channel and N-channel MOS transistors constituting the both channel transfer gates 435 and 436, respectively.

This data transmission path provided with the C element constituted as described above as a transfer control circuit is not susceptible to noise, and is capable of transmitting data at a high speed with little error. Furthermore, a transient current does not flow through the first CMOS inverter of the transfer control circuit. Therefore, the power dissipation is reduced to a great extent.

What is claimed is:

1. A coincidence element responsive to a plurality of input signals for outputting the level of N input signals, wherein N is an integer greater than one, when said plurality of input signals coincide with each other, which comprises:
    a serial connection of N first transistors of a first conductivity type and N second transistors of a second conductivity type wherein N is an integer greater than one, each of said N first transistors being associated with one of said N second transistors to form a transistor pair, each transistor of a transistor pair being responsive to an associated one of N input signals, said serial connection of N first transistors and N second transistors being connected between a first power supply and a second power supply; and
    a CMOS inverter responsive to an output intermediate between said N first transistors and said N second transistors for outputting a coincidence signal.

2. A data transmission path comprising:
    a plurality of data storage means sequentially arranged in a plurality of stages; and
    a plurality of transmission control circuits each associated with a data storage means and responsive to a control signal from a data storage means and responsive to a control signal from an adjacent stage transmission control circuit for outputting a signal for controlling its associated data storage means, wherein a coincidence element is used as said transmission control circuit, said coincidence element comprising,
    a serial connection of N first transistors of a first conductivity type and N second transistors of a second conductivity type wherein N is an integer greater than one, each of said N first transistors being associated with one of said N second transistors to form a transistor pair, each transistor of a transistor pair being responsive to an associated one of N input signals, said serial connection of N first transistors and N second transistors being connected between a first power supply and a second power supply; and
    a CMOS inverter responsive to an output intermediate between said N first transistors and N second transistors for outputting a coincidence signal.

3. A coincidence element responsive to a plurality of input signals for outputting the level of N input signals, wherein N is an integer greater than one, when said plurality of input signals coincide with each other, which comprises:
    a serial connection of N first transistors of a first conductivity type and N second transistors of a second conductivity type wherein N is an integer greater than one of said N first transistors and one of said N second transistors being responsive to a single input signal,
    a first CMOS inverter responsive to an output intermediate between said N first transistors and said N second transistors for outputting a coincidence signal; and
    a second CMOS inverter responsive to said coincidence signal for outputting an inverted signal thereof.

4. The coincidence element of claim 3, wherein said first CMOS inverter is designed to feedback its output to the intermediate output.

5. The coincidence element of claim 3, wherein said second CMOS inverter comprises a transistor having a smaller driving ability than that of said serial connection.

6. The coincidence element of claim 3, wheren a latch operating circuit is provided between the output of said second CMOS inverter and the intermediate output, said latch operating circuit causing said first and second CMOS inverters to operate as a latch circuit when said plurality of inputs do not coincide with each other.

7. A data transmission path comprising:
    a plurality of data storage means sequentially arranged in a plurality of stages; and
    a plurality of transmission control circuits each associated with a data storage means and responsive to a control signal from an adjacent transmission control circuit for outputting a signal controlling its said associated data storage means, each said transmission control circuit including a coincidence element comprising:
    a serial connection of N first transistors of a first conductivity type and N second transistors of a second conductivity type wherein N is an integer greater than one, each of said N first transistors being associated with one of said N second transistors to form a transistor pair, each transistor of a transistor pair being responsive to an associated one of N input signals, said serial connection of N first transistors and N second transistors being connected between a first power supply and a second power supply; and a first CMOS inverter responsive to an output intermediate between said N first transistors and said N second transistors for outputting a coincidence signal; and a second CMOS inverter responsive to said coincidence signal for outputting an inverted signal thereof.

8. The data transmission path of claim 7, wherein said first CMOS inverter is designed to feedback its output to the intermediate output.

9. The data tranmission path of claim 7, wherein said second CMOS inverter comprises a transistor having a smaller driving ability than that of said serial connection.

10. The data transmission path of claim 7, wherein a latch operating circuit is provided between the output of said second CMOS inverter and the intermediate output, said latch operating circuit causing said first and second CMOS inverters to operate as a latch circuit when said plurality of inputs do not coincide with each other.

11. A coincidence element responsive to a plurality N of input signals wherein N is an integer greater than one, for outputting the level of the input signals when said plurality of input signals coincide with each other, which comprises:

a serial connection of N first transistors of a first conductivity type and N second transistors of a second conductivity type wherein N is an integer greater than one, each of said N first transistors being associated with one of said N second transistors to form a transistor pair, each transistor of a transistor pair being responsive to an associated one of N input signals, said serial connection of N first transistors and N second transistors being connected between a first power supply and a second power supply; and a first CMOS inverter responsive to an output intermediate between said N first transistors and said N second transistors for outputting a coincidence signal;

a second CMOS inverter responsive to said coincidence signal for outputting an inverted signal thereof;

a CMOS transfer gate connected between the output of said second CMOS inverter and the intermediate output;

an exclusive OR circuit responsive to said two inputs for applying the exclusive OR output to one of the control inputs of said transfer gate; and a third CMOS inverter responsive to the output of said exclusive OR circuit for applying an inverted signal of the output of said exclusive OR circuit to the other of control inputs of the transfer gate.

12. A data transmission path including a plurality of data storage means sequentially arranged in a plurality of stages; and a plurality of transmission control circuits each associated with a data storage means and responsive to a control signal from an adjacent transmission control circuit for outputting a signal controlling its associated data storage means, wherein a coincidence element is used as said transmission control circuit, said coincidence element comprising:

a serial connection of N first transistors of a first conductivity type and N second transistors of a second conductivity type wherein N is an integer greater than one, each of said N first transistors being associated with one of said N second transistors to form a transistor pair, each transistor of a transistor pair being being responsive to an associated one of N input signals, said serial connection of N first transistors and N second transistors being connected between a first power supply and a second power supply; and a first CMOS inverter responsive to an output intermediate between said N first transistors and said N second transistors for outputting a coincidence signal;

a second CMOS inverter responsive to said coincidence signal for outputting an inverted signal thereof;

a CMOS transfer gate connected between the output of said second CMOS inverter and the intermediate output;

an exclusive OR circuit responsive to said two inputs for applying its exclusive OR output to one of the control inputs of said transfer gate; and a third CMOS inverter responsive to the output of said exclusive OR circuit for applying an inverted signal of the output of said exclusive OR circuit to the other of control inputs of the transfer gate.

13. A coincidence element responsive to a plurality of input signals for outputting the level of the input signals N, wherein N is an integer greater than one, when said plurality of input signals coincide with each other, which comprises:

a serial connection of N first transistors of a first conductivity type and N second transistors of a second conductivity type wherein N is an integer greater than one, each of said N first transistors being associated with one of said N second transistors to form a transistor pair, each transistor of a transistor pair being responsive to an associated one of N input signals, said serial connection of N first transistors and N second transistors being connected between a first power supply and a second power supply; and a first CMOS inverter responsive to an output intermediate between said N first transistors and said N second transistors for outputting a coincidence signal;

a second CMOS inverter responsive to said coincidence signal for outputting an inverted signal thereof;

a latch operating circuit including a parallel connection of two serial connections, each said serial connection comprising a first and a second CMOS transfer gate, and a third and a fourth CMOS transfer gate responsive to the output of said second CMOS inverter and said intermediate output, said latch operating circuit causing said first and second CMOS inverters to operate as a latch circuit when said two inputs do not coincide with each other.

14. A data transmission path including a plurality of data storage means and a plurality of transmission control circuits responsive to a control signal from an adjacent transmission control circuit for outputting a signal controlling the self stage data storage means, wherein a coincidence element is used as said transmission control circuit, which comprises:

a serial connection of a first electrically conductive type and a second electrically conductive type MOS transistors connected between a first power supply and a second power supply responsive to the coincidence output from the former stage transfer control circuit and an intermediate output from the latter stage transmission control circuit;

a first CMOS inverter responsive to said intermediate output at the connection of the lowermost stage of first conductivity type MOS transistors and the uppermost stage of second conductivity type MOS transistors for outputting an inverted signal of said intermediate output to output a coincidence signal;

a second CMOS inverter responsive to said coincidence signal for outputting an inverted signal thereof; and a latch circuit constituted by a parallel connection of two serial connections, each comprising a first and a second, and a third and a fourth CMOS transfer gate responsive to the output of said second CMOS inverter and said intermediate output for making said first and second CMOS inverters constitute a latch circuit when said two inputs do not coincide with each other.

* * * * *